United States Patent

[11] 3,602,734

[72] Inventors Yasuo Matsukura;
Kuniichi Ohta; Toshio Wada, all of Tokyo-to, Japan
[21] Appl. No. 771,427
[22] Filed Oct. 29, 1968
[45] Patented Aug. 31, 1971
[73] Assignee Nippon Electric Company, Limited
Tokyo-to, Japan
[32] Priority Oct. 31, 1967
[33] Japan
[31] 42/7012

[54] SEMICONDUCTOR DEVICE EMPLOYING GUNN EFFECT ELEMENTS
5 Claims, 11 Drawing Figs.

[52] U.S. Cl. .......... 307/214, 307/201, 307/213, 307/299, 317/234 V, 331/107 G
[51] Int. Cl. .......... H03k 11/40, H03k 19/34, H03k 19/36
[50] Field of Search .......... 307/214, 299; 331/107 G; 317/234 V

[56] References Cited
UNITED STATES PATENTS

| | | | |
|---|---|---|---|
| 3,451,011 | 6/1969 | Uenohara | 331/107 |
| 3,466,563 | 8/1969 | Thim | 331/107 |

*Primary Examiner*—Roy Lake
*Assistant Examiner*—Darwin R. Hostetter
*Attorney*—Hopgood and Calimafde

ABSTRACT: A inhibited NOT circuit is described utilizing the Gunn effect. The NOT circuit is formed by connecting several semiconductor regions of the bulk negative resistance effect type in series relationship with interconnecting regions having sufficient conductivity to naturally suppress the formation of high field domains therein. The sizes and shapes of the semiconductor regions are so selected that in response to a bias voltage applied to electric field biasing electrodes one of the regions supports continuous high field domain oscillations unless inhibited by the formation of a high field domain in another semiconductor region. Several NOT logic devices are shown and described such as the NOR, the NAND and the R junction.

INVENTORS
YASUO MATSUKURA
KUNIICHI OHTA
TOSHIO WADA
BY
Hopgood & Calimafde
ATTORNEYS

INVENTORS
YASUO MATSUKURA
KUNIICHI OHTA
TOSHIO WADA

BY Hopgood & Calimafde
ATTORNEYS

INVENTORS
YASUO MATSUKURA
KUNIICHI OHTA
TOSHIO WADA
BY
Hopgood & Calimafde
ATTORNEYS

SEMICONDUCTOR DEVICE EMPLOYING GUNN EFFECT ELEMENTS

This invention relates to a semiconductor device utilizing the high electric field layer (domain) produced due to the bulk negative resistance effect.

With the rapid increase in the volume of information processing in recent years, the realization of higher speed logic elements has become an important subject. To this end, there have been developed for use in place of *p–n* junction semiconductor elements such as transistors and Esaki diodes, known as IMPATT elements which utilize the negative resistance caused by the electron avalanche phenomenon, a semiconductor element (hereinafter referred to as the Gunn effect element) utilizing the high field domain arising from a bulk negative resistance effect. In comparison with the IMPATT element, the Gunn effect element can be easily handled and the noise generated in the element is small. Therefore, the Gunn effect element was at first developed for use as a high-speed pulse source or a high-speed switching element or a high-speed memory element, etc. As reported in detail in "-DENSHI ZAIRYO" (Electronic Materials in Japanese), May 1967, pages 20–24 and U.S. Pat. No. 3,365,583 issued to I.B.M. for example, Gunn effect elements utilize the property of the high electric field domains produced in the vicinity of the cathode whentheelectricfieldinthesemiconductorregionexceedsathresholdvalue.

While the conventional Gunn effect element has strict limitations as regards the concentration and area of the sample semiconductor region, practical compositional data have not yet been clarified. To utilize a Gunn effect element, especially as a logic element, it is necessary to develop a NOT element as an original circuit to fully realize the potential of Gunn logic devices.

A prime object of his invention is therefore to provide a specific Gunn effect element structure, which is used as a NOT element and to attain a complete inventory of Gunn logic devices.

Another object of this invention is to provide a semiconductor element, such as a NAND element, NOR element, neuristor element, high-frequency element, or the like, which become obtainable from the Gunn effect NOT element.

The above-mentioned and other features and objects of this invention and the manner of attaining them will become more apparent and the invention itself will best be understood by reference to the following description of embodiments of the invention taken in conjunction with the accompanying drawings, the description of which follows:

FIG. 1 is a diagram illustrating the principle of Gunn effect semiconductor elements;

FIGS. 2*a* through 2*c* are a plan view, a longitudinal sectional view and a characteristic curve, respectively, of the first embodiment of this invention;

FIGS. 3*a* through 3*c* are diagrams showing the input and output waveforms of the first embodiment;

According to the present invention, there is provided a semiconductor device comprising at least two Gunn effect semiconductor regions, a conductive region which is disposed between said regions so as to connect said regions in series with each other and wherein the conductive region has a conductivity which is higher than that of said Gunn effect semiconductor regions, and means for applying a voltage across the body formed by said series-connected regions to establish electric fields therein sufficient to normally produce Gunn oscillations in one of the Gunn effect regions unless inhibited by the Gunn effect oscillation in another series-connected Gunn effect region.

In the semiconductor device of this invention, the respective semiconductor regions are connected in series with each other in an intermediate area of the high conductive means, and these semiconductor regions serve as loads to one another, whereby a domain is produced in one of the semiconductor regions, the impedance of this region is increased and, as a result, the internal average field of the other semiconductor region is reduced, and thus occurrence of the domain is suppressed and the output signal obtained from the domain of said other semiconductor region is stopped.

Figure 1:
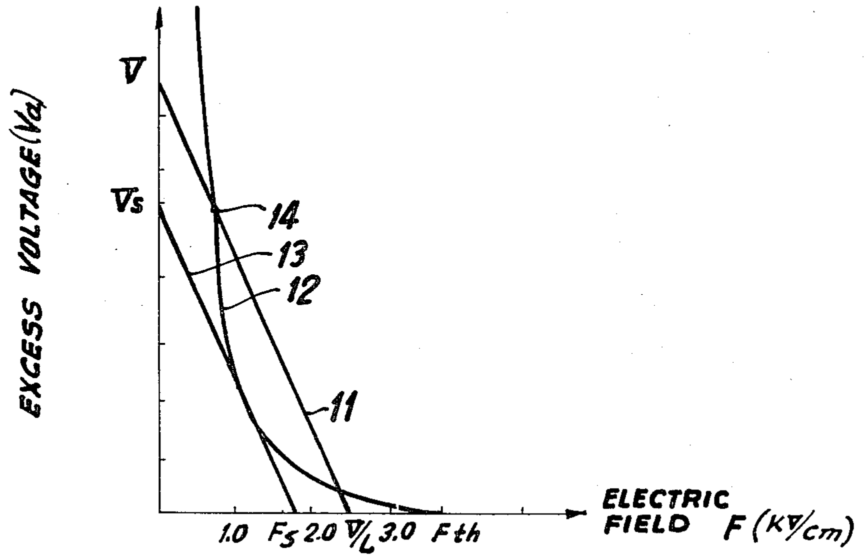

Referring to FIG. 1, the abscissa indicates an electric field $F$ and the ordinate represents an excess domain voltage $V_d$ of a high electric field domain. When a voltage $V$ is applied across a rectangular parallelepiped Gunn effect semiconductor element whose length is $L$ and whose impurity distribution is uniform, the following relationship is observed between the field $F_l$ of the low field area in the semiconductor region and the domain voltage $V_d$ appearing across the domain:

$$V_d = V - F_l L$$

This relationship is expressed by the load straight-line 11 of FIG. 1. The semiconductor region responds as indicated by a curve 12, which is determined parametrically by the concentration of the impurity. The condition for generating or sustaining the domain can be determined by the curve 12 and load straight-line 11 which are peculiar to the semiconductor region. A load line 13 tangentially contacting the curve 12 and parallel to curve 11 represents the minimum sustaining voltage $Vs$ and the minimum sustaining field $Fs$ for a high field domain in the semiconductor region. The high field domain may be established when the electric field is in the range between the minimum field $Fs$ and the threshold electric field $F$th as determined by the applied voltage. Thus, no high field domain can be grown when the mean field $V/L$ in the region of a semiconductor (whose length is $L$ and to which is applied a voltage $V$) is held above the sustaining field $Fs$ but less than the threshold field $F$th. If, however, a part of the electric field within the semiconductor region is raised above the threshold field $F$th by an external means, a high field domain is produced in said part and can be maintained until it reaches the anode.

Figure 2A:
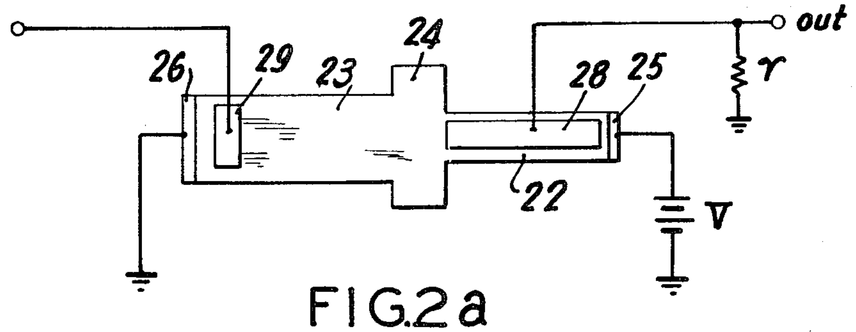
Figure 2B:
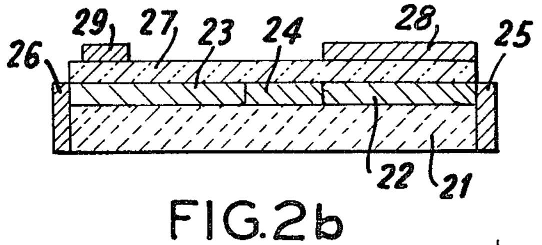
Figure 2C:
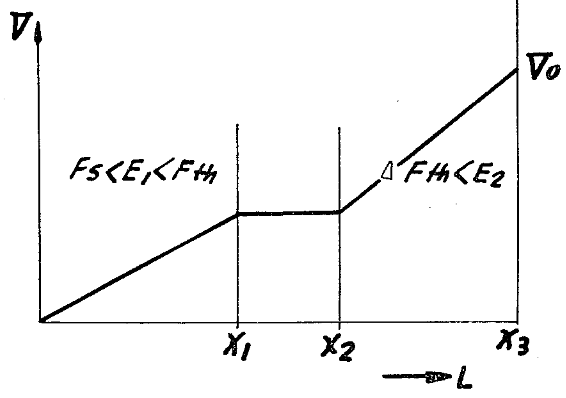

FIG. 2 shows the first embodiment of this invention, wherein a GaAs epitaxial layer of 15 microns thick containing $10^{15}$ atoms/cm.$^3$ of tellurium is grown on a GaAs base 21. On a geometrical plane of this epitaxial layer, a first semiconductor region 22 with a length of 100 microns and a width of 15 microns, a second semiconductor region 23 with a length of 100 microns and a width of 20 microns, and a third semiconductor region 24 with a length of 10 microns and a width of 100 microns are formed. Then, an anode electrode 25 and a cathode electrode 26 are placed in ohmic contact with said first and second regions, respectively. An output electrode 28 is disposed on the first region 22 with a silicon oxide film 27 beneath electrode 28 and deposited onto said first, second and third regions. A control electrode 29 is disposed over the second region 23 with silicon oxide film 27 between electrode 29 and the second region. The structure thus formed as shown in FIG. 2 is a NOT element. The mean electric fields within these regions differ from each other because the geometric variations and the mean electric field may be varied according to the voltage applied to the NOT element from a power source $V_o$. For example, when the power source $V_o$ has a voltage of approximately 70., the mean electric field distribution produced thereby is 4kv./cm., in the first region 22, 3kv./cm., in the second region 23, and 0.6kv./cm., in the third region 24. Since in the GaAs element the intensity of the electric field necessary to produce the high field domain is about 3.2kv./cm. A Gunn oscillation arises in the first region 22 with a time period $T$ that can be expressed by $$T \approx L/V,$$

where $L$ is the length of the first region 22 and $v$ is the drift velocity of the high field domain. Since the moving velocity of the high field domain is approximately $10^7$cm./sec, the period $T$ is approximately 1 nanosecond. The electric field in the second region 23 is held within the range of about 1.8 to 3kv./cm., during the repetition of the growth and the disappearance of the high field domain in the first region.

The NOT function is obtained with the element of FIGS. 2*a* and 2*b* by utilizing the property that the occurrence of a high field domain increases the resistance and decreases the current in the semiconductor region where the domain is present. This property is used in the device of FIGS. 2*a* and 2*b* by triggering a high field domain in the second region 23 by the use of control electrode 29 whereby the resistance of the second region is sufficiently increased to cause a lowering of the electric field in the first region 22 to a level below that necessary for generating a high field domain therein. Thus a pulse output from output electrode 28 can be prevented by applying a control pulse to the control electrode 29.

Figure 3A:
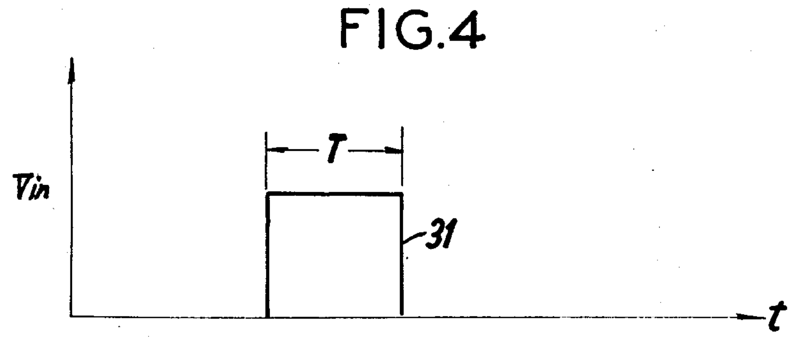
Figure 3B:
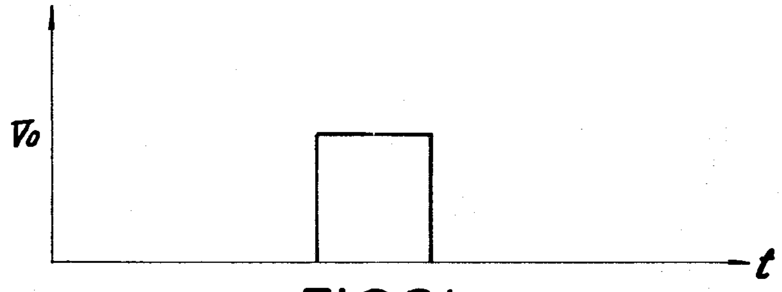
Figure 3C:
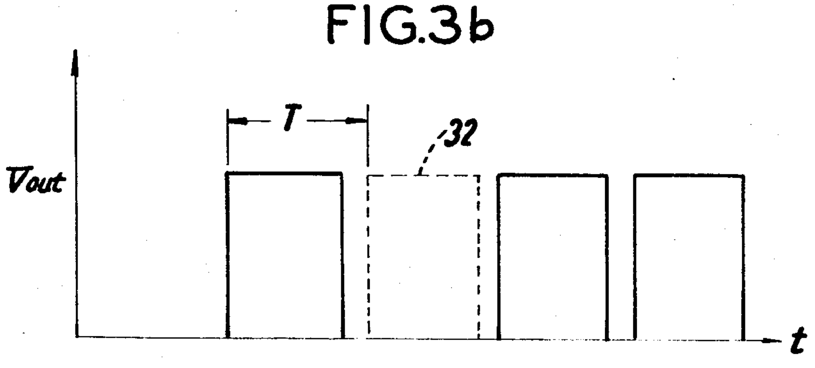

With reference to the specific values of electric field intensity which, as previously explained, are obtained when the voltage $V_o$ is 70 volts and the fact that the minimum sustaining field Fs is approximately 2.0kv./cm., the NOT function may be explained as follows: A pulse 31 as shown in FIG. 3*a* is applied to the control electrode 29. This effectively raises the electric field in the second region 23 by approximately 1.0kv./cm., and when the high field domain in the first region 22 has vanished, a high field domain is produced, as evidenced by the pulse of FIG. 3*b*, in the second region 23 and is transmitted toward the third region 24. Note that since the mean electric field in the first region 22 is reduced to about 3.0kv./cm., while the domain is present in the second region 23, the field of the first region is insufficient to support Gunn oscillations. Consequently, an output pulse signal 32 (FIG. 3*c*) which would have been produced is deleted and FIG. 3*c* is the logical NOT signal. By utilizing this property, a NOT element having various functions can be obtained.

In the sample element as in FIG. 2, the length of the first region 22 is equal to that of the second region 23. However, the operation of the first region 22 can also be stopped for a desired period by arranging the length of the second region to be longer than that of the first region 22. Also, sensitivity of the NOT operation in response to the control pulse can be improved by setting the field of the second region at 2 to 3kv./cm., when the first region 22 is oscillating and vice versa. It is also possible to replace the third region 24 with a highly concentrated impurity region formed by diffusing *n*-type impurities or a metallic electrode since this third region is a highly conductive region of very low electric field intensity so that the high field domain of the second region 23 can vanish at the boundary between regions 23 and 24.

Figure 4:
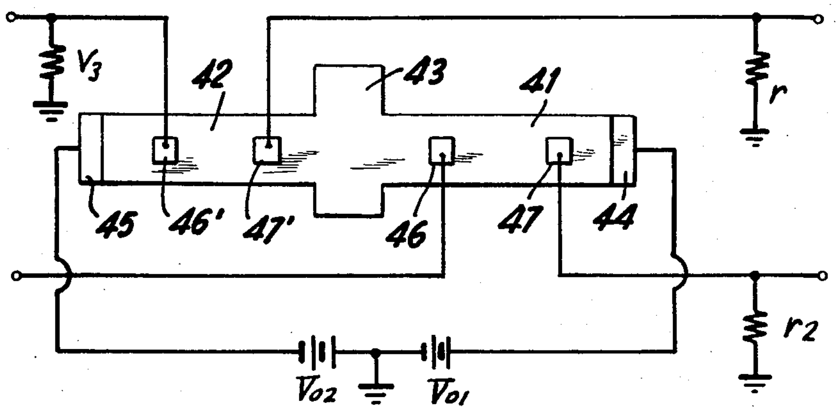
FIG. 4 is a plan view illustrating the second embodiment of this invention.

FIG. 4 illustrates the second embodiment of this invention. According to this embodiment, an R-junction element can be obtained by utilizing the Gunn effect features, such as waveform shaping function, threshold value function by the growth field, high speed domain propagation, denial or responseless junction as in the foregoing NOT element. The R-junction element is necessary when forming a neuristor element, for which a description may be found in "Proceedings of the IRE", Oct. 1962, pages 2048–2060. The R-junction element is such that one of two signal lines becomes inoperative for the period that a signal is propagated over the other signal line. FIG. 4 shows said R-junction element in which first and second semiconductor regions 41 and 42 whose lengths and widths are made equal are connected in series to each other by way of a highly conductive region 43, power supply terminals 44 and 45 are provided at both ends of the conductive region 43, and control electrodes 46 and 46' and output electrodes 47 and 47' are formed at the first and second regions, respectively. A voltage is applied to this element of such a value that the first and second regions 41 and 42 have an electric field intensity corresponding to the sustaining field. By applying a control pulse for instance to the control input 46, a high field domain is produced in region 41 and an output pulse appears at the output electrode of the region 41. At the same time that a high field domain occurs in region 41, the mean electric field is reduced in the region 42. As a result, the region 42 does not have a sustaining field Fs and enters a responseless period during which it cannot provide a high field domain from pulses applied to electrode 46'. Then, by using the sample having the same impurity concentration as in the first embodiment of FIG. 2, wherein the mean field is set at 3kv./cm., when the length of each semiconductor region is 100 microns, a control pulse applied to one of the regions lowers the electric field value of the other region to 1.8kv./cm., which is below the minimum sustaining field of 2kv./cm., so that the other region enters a responseless period of about 1 nanosecond.

The neuristor element using the described Gunn effect element is especially suited for use in high-speed active lines because inductive elements are unnecessary.

Figure 5:
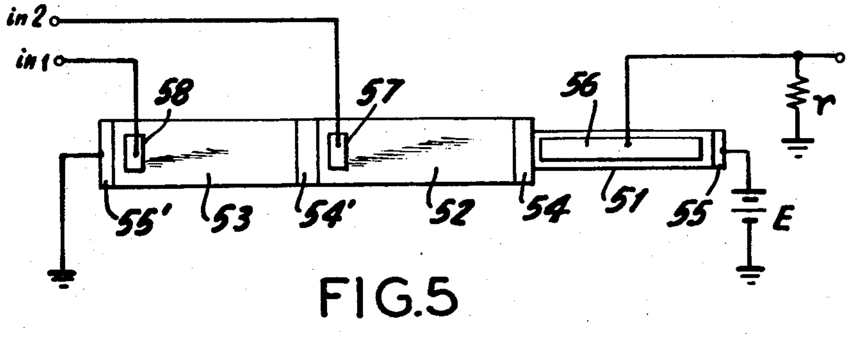
FIGS. 5, 6 and 7 are plan views respectively of still other embodiments of this invention.
Figure 6:
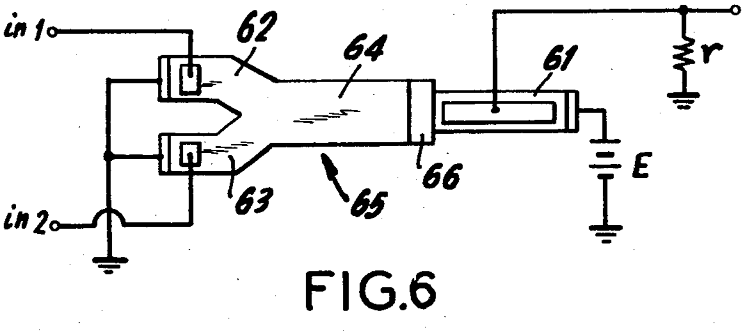
Figure 7:
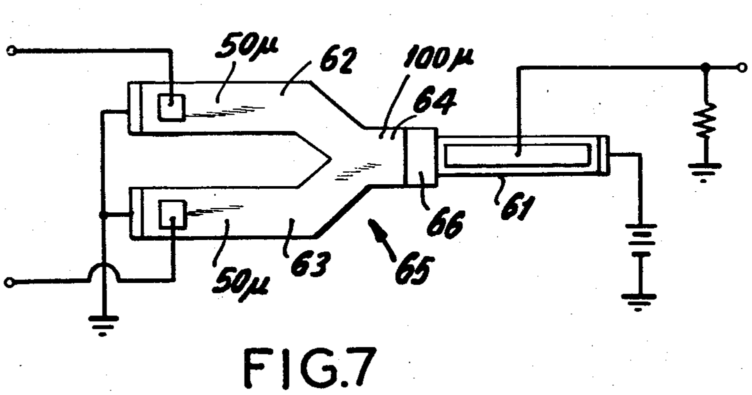

According to the other embodiments of the invention as illustrated in FIGS. 5 through 7, a logic element, such as a NAND element and NOR element, can be obtained by only modifying the NOT element region which is held at the sustaining electric field intensity.

The logic element of FIG. 5 comprises a NOR element utilizing three Gunn effect semiconductor regions having equal lengths and wherein the resistance of the longitudinal direction of a first semiconductor region 51 is made twice the resistance of a second and a third semiconductor region 52 and 53. High conductive intermediate regions 54 and 54' are provided, which interconnect said semiconductor regions in series with each other. Power supply terminals 55 and 55', representing the anode and cathode respectively, are provided at the ends of the series-connected regions, and output electrode 56 disposed at the first region 51. Control electrodes 57 and 58 are disposed at the second and third regions 52 and 53 respectively. According to this logic element, the mean electric field in the first region 51 is twice as much as that within the second and third regions 52 and 53. In actual values, this means that the mean electric field in the first region is at 4 to 5kv./cm., and the mean electric fields of the second and third regions 52 and 53 are held at the sustaining field level of between 2 to 2½kv./cm. The NOR operation is obtained when a high field domain is produced in either of the second or third regions 52 and 53 because these high field domains effectively suppress the domains in the first region.

FIG. 6 shows a logic element embodying this invention, in which a first semiconductor region 61 is connected in series via a high conductive region 66 to a second semiconductor region 65 composed of two short branch regions 62 and 63 having widths equal to that of the first semiconductor region 61 and wherein the branch regions 62 and 63 are connected to region 66 via a long main region 64 having a width which is twice the width of the first semiconductor region 61. The ends of said branches 62 and 63 are commonly connected to the negative terminals of the power source, thereby effecting NAND operation. In other words, the second semiconductor region 65 alone acts as an AND element, in which the high field domain is transferred to the long main region 64 only when a high field domain takes place simultaneously in all the branch regions. The mean electric field of the first region 61 is lowered when a high field domain is existent in said main region 64.

FIG. 7 shows a logic element of the invention, wherein the parts in common to FIG. 6 are indicated by identical numeral references. The lengths of branch regions 62 and 63 are made sufficiently longer than that of the main region 64 to effect a NOR operation. This is made possible because the branches 62 and 63 of FIG. 7 are sufficiently long so that the impedance variation produced in either by a high field domain significantly affects the electric field in the region 61. Accordingly, a high field domain may be initiated in either branch 62 or 63 independently. In other words, this logic element, in spite of using an AND like element as in FIG. 6, performs a NOR operation whereby occurrence of the high field domain in the first semiconductor region 61 can be prevented by the domain of either one of the branches.

Several embodiments have been described in which the control electrode and output electrode are provided at the semiconductor region via an insulator such as silicon oxide film. However, these electrodes may be installed therein by using a *p–n* junction or ohmic contact. The above-mentioned structure of the semiconductor device may be made of the GaAs region epitaxially grown on a *p*-type germanium single crystal substrate forming a heterojunction with the substrate. Alternatively, a single crystal GaAs may be used to form the semiconductor device without any substrate material. Also, instead of GaAs, a piezoelectric semiconductor or germanium having trapping centers which make it possible to utilize the high field domain may be used with this invention.

While a few embodiments of the invention have been illustrated and described in detail, it is particularly understood that the invention is not limited thereto and covers all the semiconductor devices comprising circuit means as defined in the appended claims.

We claim:

1. A semiconductor device comprising first and second Gunn effect semiconductor regions, a conductive region having a conductivity higher than that of said first and second Gunn effect semiconductor regions and connected between said first and second Gunn effect semiconductor regions, a first electrode disposed at the end of said first Gunn effect region opposite to said conductive region, a second electrode disposed at the end of said second Gunn effect region opposite to said conductive region, biasing means connected between said first and second electrodes to bias said first and second Gunn effect regions and said conductive region at a voltage that normally produces Gunn oscillation in said first Gunn effect region, and means associated with said second Gunn effect region for applying an input signal to said second Gunn effect region to generate a high field domain in said second Gunn effect region, wherein the Gunn oscillation in said first Gunn effect region is suppressed upon generation of the high field domain in said second Gunn effect region.

2. The device as recited in claim 1, and further including an output electrode coupled to the first region to detect high field domains therein and a control electrode coupled to the second region to initiate a high field domain therein, and a cathode coupled to the second region and an anode coupled to the first region.

3. The device as recited in claim 1, wherein said first and second regions are selectively shaped to present said related resistances.

4. The device as recited in claim 3, wherein the first and second regions are formed of the same material and have the same length with said first region narrower than said second region to break into high field domain oscillations prior to said second region.

5. The device as recited in claim 4, wherein the third region is formed of the same semiconductor material as said first and second region and has a width substantially greater than said first and second regions to normally suppress high field domains in the third region.

UNITED STATES PATENT OFFICE
CERTIFICATE OF CORRECTION

Patent No. 3,602,734 Dated August 31, 1971

Inventor(s) Yasuo Matsukura et al.

It is certified that error appears in the above-identified patent and that said Letters Patent are hereby corrected as shown below:

On the cover sheet [31], "42/7012" should read -- 42/70122 --

Signed and sealed this 12th day of September 1972.

(SEAL)
Attest:

EDWARD M.FLETCHER,JR.
Attesting Officer

ROBERT GOTTSCHALK
Commissioner of Patents